(12) United States Patent
Ye et al.

(10) Patent No.: US 6,965,260 B1
(45) Date of Patent: Nov. 15, 2005

(54) SYSTEM AND METHOD FOR INCREASING EFFECTIVE PULSE-WIDTH MODULATED DRIVE SIGNAL RESOLUTION AND CONVERTER CONTROLLER INCORPORATING THE SAME

(75) Inventors: Ron Ye, Richardson, TX (US); Lam Vu, Plano, TX (US); Minghua Fu, Plano, TX (US)

(73) Assignee: Tyco Electronics Power Systems, Inc., Mesquite, TX (US)

( * ) Notice: Subject to any disclaimer, the term of this patent is extended or adjusted under 35 U.S.C. 154(b) by 11 days.

(21) Appl. No.: 10/812,531

(22) Filed: Mar. 30, 2004

(51) Int. Cl.[7] .............................................. H03K 5/13
(52) U.S. Cl. ..................................... 327/175; 375/238
(58) Field of Search .............................. 327/170, 171, 327/172, 173, 174, 175; 375/238

(56) References Cited

U.S. PATENT DOCUMENTS 5,945,857 A * 8/1999 Havens ....................... 327/175
6,665,338 B1 * 12/2003 Midya et al. ................ 375/238

* cited by examiner

Primary Examiner—Lihn My Nguyen

(57) ABSTRACT

A system for, and method of, increasing effective pulse-width modulated (PWM) drive signal resolution and a power converter incorporating the system or the method. In one embodiment, the system includes: (1) a duty cycle calculator configured to calculate a theoretical duty cycle for a PWM drive signal to be provided to an associated power converter based on at least one operating condition thereof, the theoretical duty cycle not a member of a pre-established set of allowable duty cycles and (2) a duty cycle approximator coupled to the duty cycle calculator and configured to generate a sequence of members of the set of allowable duty cycles, wherein the sequence at least approximately averages to the theoretical duty cycle.

21 Claims, 4 Drawing Sheets

SYSTEM AND METHOD FOR INCREASING EFFECTIVE PULSE-WIDTH MODULATED DRIVE SIGNAL RESOLUTION AND CONVERTER CONTROLLER INCORPORATING THE SAME

TECHNICAL FIELD OF THE INVENTION

The present invention is directed, in general, to power conversion and, more specifically, to a system and method for increasing effective pulse-width modulated (PWM) drive signal resolution and a power converter that incorporates the system or the method to achieve reduced output voltage distortion.

BACKGROUND OF THE INVENTION

Over the last several years, digital controllers have come into use for controlling the operation of power converters (e.g., DC/DC converters, cycloconverters, inverters and synchronous rectifiers). Like their analog predecessors, digital controllers form a part of a compensation loop that senses converter operating conditions and produces a pulse-width modulated (PWM) drive signal that controls the operation of one or more power switches in the power converter based on the converter operating conditions. Although suitable for a wide variety of processors, digital controllers are frequently embodied in digital signal processors (DSPs), which are well known to those skilled in the pertinent art.

Many digital controller topologies use a counter that counts up or down to define the PWM drive signal switching interval or period (defined as a full 360° "on-off" switching cycle and typically held constant) and duty cycle (defined as the percentage of that switching cycle during which the switch is "on," which changes based on converter operating conditions). The same clock that drives the DSP drives the counter. For this reason, both the switching interval and the duty cycle are conveniently expressed in terms of clock cycles.

For example, if a counter is to generate a 100 KHz switching interval and is driven by a 10 MHz clock, 100 clock cycles ($10 \times 10^9/100 \times 10^6$) define the switching interval, and the duty cycle can assume integer values between 0 and 100 clock cycles. (As a practical matter, however, good controller design recommends maintaining the duty cycle at around 50%, or 50 clock cycles in the given example, under nominal converter operating conditions.) The result is that 100 discrete pulse widths are possible, each of which are 0.1 $\mu$S apart. Given a duty cycle of 50%, the pulse width of the PWM drive signal is 5 $\mu$S, resulting in a resolution of 2% (0.1 $\mu$S/5 $\mu$S).

Continuing the above example, the converter controller may determine that a duty cycle of 50.5% is required to produce a desired 48.48 volt converter output. Unfortunately, as is readily apparent, only integer duty cycles are possible; resolution below 2% is unattainable. Therefore, conventional converter controllers are forced to select a duty cycle of either 50% or 51%. Consequently, the power converter produces an output voltage that is either lower or higher than the desired 48.48V. The converter controller will respond to this suboptimal operating condition by vacillating between 50% and 51% duty cycles in an unpredictable fashion. The result is that a 2% ripple is created in the converter output voltage. Unfortunately, due to the nature of the compensation loop, this ripple is of relatively low frequency (on the order of perhaps several kilohertz) and aperiodic. The 2% ripple translates to 960 mV if the desired output voltage is 48.48V. Not only does this amount of ripple fail most power converter requirements, its relatively low and varying frequency makes filtering quite difficult.

A simple solution to this problem would be to double the clock rate to accommodate a 50.5% duty cycle. However, faster clocks and DSPs are more expensive and consume more power. Furthermore, a faster DSP may only temporarily satisfy the need for higher resolution PWM drive signals: today's "high resolution" PWM signal may be tomorrow's "low resolution" PWM signal. Thus, even with faster DSPs, the need for increasing the resolution of PWM signals without increasing the clock rate still acutely exists.

What is needed in the art is a way to improve PWM signal resolution in a digital converter controller without requiring a faster clock.

SUMMARY OF THE INVENTION

To address the above-discussed deficiencies of the prior art, one aspect of the present invention provides a system for increasing effective PWM drive signal resolution. In one embodiment, the system includes: (1) a duty cycle calculator configured to calculate a theoretical duty cycle for a PWM drive signal to be provided to an associated power converter based on at least one operating condition thereof, the theoretical duty cycle not a member of a pre-established set of allowable duty cycles and (2) a duty cycle approximator coupled to the duty cycle calculator and configured to generate a sequence of members of the set of allowable duty cycles, wherein the sequence at least approximately averages to the theoretical duty cycle.

Thus, the present invention at least approximates the theoretical duty cycle by generating a sequence of the members of the set of allowable duty cycles over adjacent switching intervals. The theoretical duty cycle is the duty cycle needed to produce a desired converter operation. An allowable duty cycle is a real duty cycle that the PWM drive signal can assume. The present invention comes into play when the theoretical duty cycle does not equal any allowable duty cycle.

In another aspect, the present invention provides a method of increasing effective pulse-width modulated drive signal resolution. In one embodiment, the method includes: (1) calculating a theoretical duty cycle for a PWM drive signal to be provided to an associated power converter based on at least one operating condition thereof, the theoretical duty cycle not a member of a pre-established set of allowable duty cycles and (2) generating a sequence of members of the set of allowable duty cycles, wherein the sequence at least approximately averages to the theoretical duty cycle.

In yet another aspect, the present invention provides a power converter. In one embodiment, the power converter includes:

(1) at least one power switch interposing at least two input lines and at least two output lines and (2) a converter controller for providing a PWM drive signal to the at least one power switch, including: (2a) a duty cycle calculator configured to calculate a theoretical duty cycle for the PWM drive signal based on at least one operating condition of the power converter, the theoretical duty cycle not a member of a pre-established set of allowable duty cycles and (2b) a duty cycle approximator coupled to the duty cycle calculator and configured to generate a sequence of members of the set of allowable duty cycles, wherein the sequence at least approximately averages to the theoretical duty cycle.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
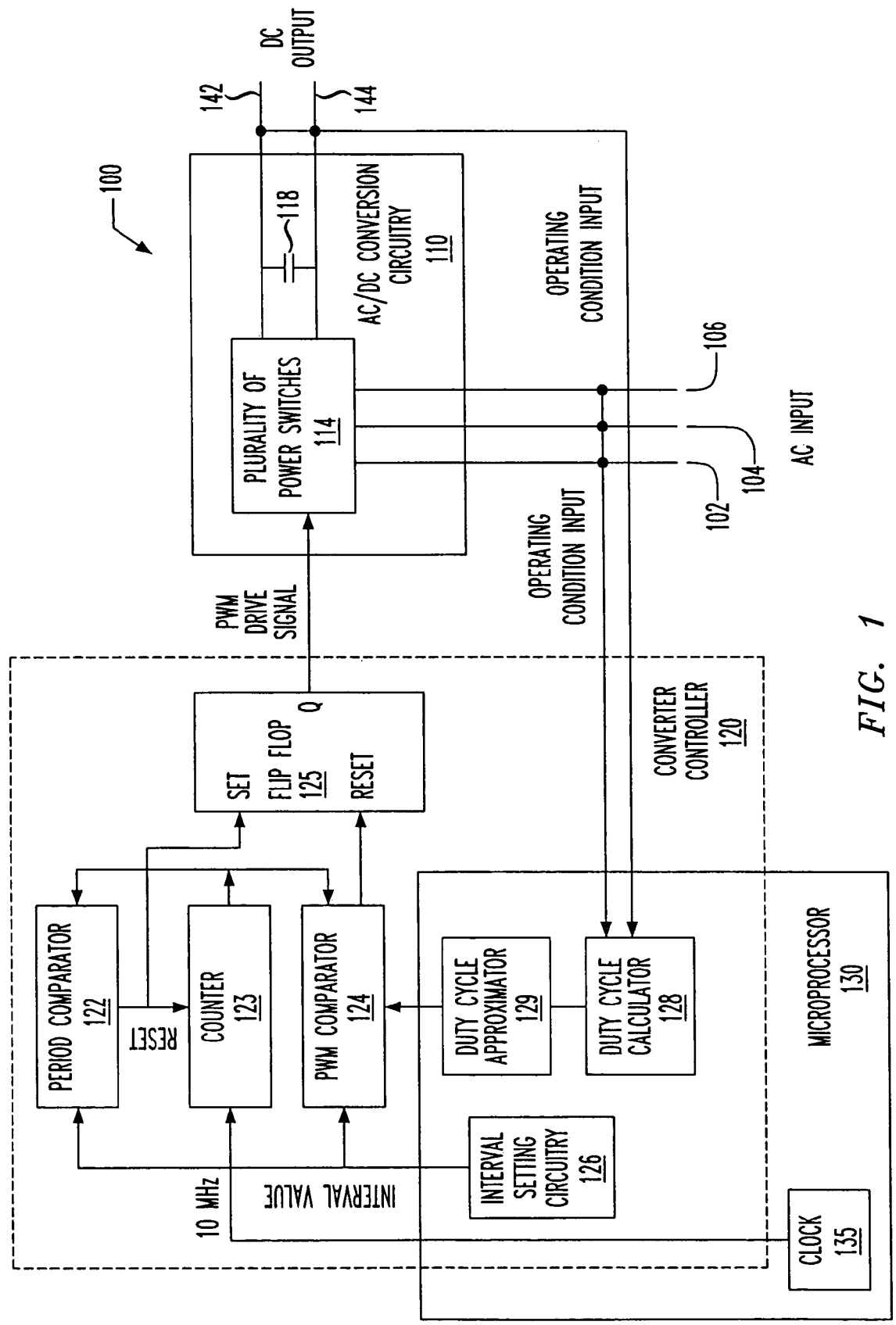
FIG. 1 illustrates a block diagram of one example of a power converter that incorporates a system constructed, or a method carried out, according to the principles of the present invention.

Referring initially to FIG. 1, illustrated is a block diagram of one example of a power converter, generally designated 100, that incorporates a system constructed, or a method carried out, according to the principles of the present invention. The power converter 100 includes a first, a second and a third input line 102, 104, 106, AC/DC conversion circuitry 110, a converter controller 120, a DSP 130 (one type of processor suitable for operating as a converter controller), and first and second output lines 142, 144. The AC/DC conversion circuitry 110 includes a plurality of power switches 114 and an energy storage device 118. The converter controller 120 includes a period comparator 122, a counter 123, a PWM comparator 124, a flip-flop 125, interval setting circuitry 126, a duty cycle calculator 128 and a duty cycle approximator 129.

The power converter 100 is a power rectifier configured to convert an AC three-phase input voltage into a DC output voltage. The power converter 100 may be employed, for example, within a motor drive, a uninterruptible power supply (UPS) or as part of a larger converter, such as a DC/DC power converter in which a constant DC voltage is provided.

The AC/DC conversion circuitry 110 is a hardwired circuit made up of both passive and active components found in conventional AC/DC conversion circuits. The AC/DC conversion circuitry 110 receives the AC three-phase input voltage via the three input lines 102, 104, 106, and provides the DC output voltage via the output lines 142, 144. The plurality of power switches 114 interpose the input lines 102, 104, 106, and the output lines 142, 144. Through operations of the plurality of power switches 114, the AC three-phase input voltage is provided to the energy storage device 118. The energy storage device 118 often takes the form of a power capacitor. From the energy storage device 118, the desired DC output voltage is provided on the output lines 142, 144. Typically, the AC/DC conversion circuitry 110 includes an output filter that filters out a ripple at the DC output associated with duty cycle switching. One skilled in the pertinent art understands the configuration and operation of the AC/DC conversion circuitry 110 and that other components not illustrated or discussed may be included therein.

The converter controller 120 is configured to control the operations of the plurality of power switches 114 by providing a PWM drive signal thereto. In some embodiments, additional circuitry may be employed to process the PWM drive signal before it is received by the plurality of switches 114. Portions of the converter controller 120 may be implemented as a sequence of operating instructions, dedicated hardware, general purpose hardware or a combination thereof. At least some portions of the converter controller 120 may be embodied in a DSP or any other type of processor. As illustrated in FIG. 1, at least a portion of the converter controller 120 is embodied in a DSP.

The PWM drive signal activates (turns on) and deactivates (turns off) the plurality of power switches 114 to control the AC input voltage supplied to the energy storage device 118 and, thus, control the DC output voltage. By changing the duty cycle, the DC output voltage can be changed to a desired value. Thus, the converter controller 120 controls the duty cycle to obtain the desired DC output voltage. Additionally, the converter controller 120 improves the resolution of the PWM drive signal and thus permits easier filtering of the resulting ripple at the DC output.

The period comparator 122, counter 123, PWM comparator 124, flip-flop 125 and interval setting circuitry 126 are employed in conventional converter controllers or in a hybrid microcontroller. The interval setting circuitry 126, embodied in the DSP 130, calculates an interval value to set the period comparator 122 to obtain a desired switching interval for the PWM drive signal. The interval value is established based on the rate of the clock 135. Solely for purposes of discussion, the following exemplary values will be used. The rate of the clock 135 is 10 MHz and the PWM drive signal switching interval is 100 KHz. Accordingly, the interval value in terms of clock cycles is 100 such that the period comparator 122 is set to a value of 100. As a result, a PWM drive signal of 100 KHz (10 MHz/100) frequency and 10 $\mu$S (1/100 KHz) period is generated.

The counter 123, driven by the clock 135, counts up (for example) each switching interval to generate the PWM drive signal. The period comparator 122 compares a value of the counter 123 to the interval value. When the counter 123 reaches a value of 100, the period comparator 122 outputs a reset signal. The reset signal resets the counter 123 to zero and sets the flip-flop 125, sending its output high.

The PWM comparator 124 is set to a value corresponding to an allowable duty cycle that is less than or equal to the interval value of the duty cycle approximator 129. Once again, solely for purpose of discussion, the set of allowable duty cycles includes only integer values, viz. 50% and 51%. When the counter 123 reaches a value equaling the allowable duty cycle (50 or 51 in this example), the PWM comparator 124 goes high and resets the flip-flop 125, sending its output low. Accordingly, the flip-flop 125 generates either a 50% or a 51% PWM drive signal. The PWM comparator 124 is set according to the duty cycle calculator 128 and the duty cycle approximator 129.

The duty cycle calculator 128 is configured to calculate a theoretical duty cycle for the PWM drive signal based on at least one operating condition of the power converter 100. The operating condition may be, for example, an input current, an input voltage, an output current, an output voltage or any other suitable operating condition. The duty cycle calculator 128 may calculate a theoretical duty cycle that is not a member of the set of allowable duty cycles. In some embodiments, the set of allowable duty cycles includes only integers. In other embodiments, the set of allowable duty cycles includes only members chosen as a function of the relationship between the clock rate and the switching interval of the PWM drive signal.

Figure 4:
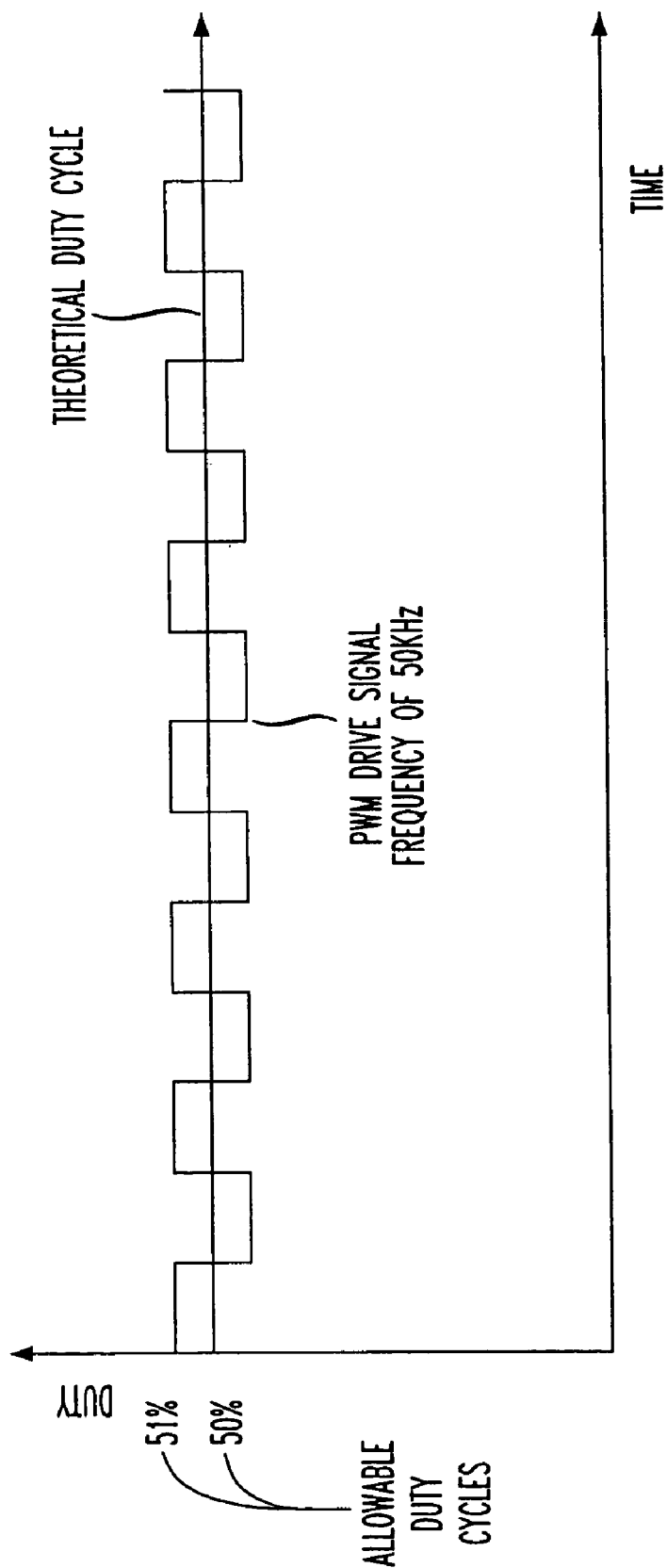
FIG. 4 illustrates an exemplary sequence of allowable duty cycles provided by the duty cycle approximator of FIG. 2 or generated according to the method of FIG. 3.

The duty cycle approximator 129, coupled to the duty cycle calculator 128, is configured to generate a sequence of the members of the set of allowable duty cycles, wherein the sequence at least approximately averages to the theoretical duty cycle when the theoretical duty cycle is not a member of the set. For example, if the theoretical duty cycle is 50.5%, and 50.5% is not a member of the set of allowable duty cycles, the duty cycle approximator 129 may set the PWM comparator 124 to a value of 51 in one PWM drive signal cycle and to a value of 50 in the next PWM drive signal cycle. The result is a PWM drive signal having alternating duty cycles of 51%, 50%, 51%, 50%, and so on, as FIG. 4 illustrates.

In one embodiment, the length of the sequence is at least approximately proportional to the reciprocal of the fractional part of the theoretical duty cycle. In other embodiments, the sequence of allowable duty cycles contains only allowable duty cycles immediately greater than and immediately less than the theoretical duty cycle. Examples supporting these two statements will be set forth in conjunction with FIGS. 2 and 4, below.

Figure 2:
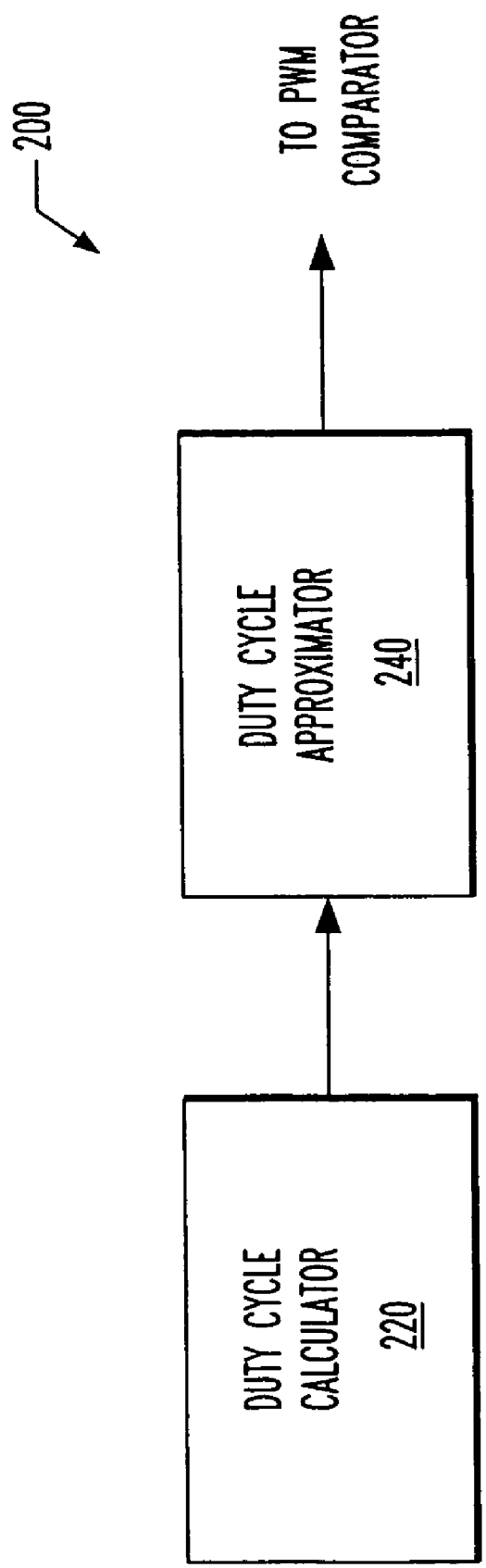
FIG. 2 illustrates a block diagram of one embodiment of a system for increasing effective PWM drive signal resolution constructed according to the principles of the present invention.

Turning now to FIG. 2, illustrated is a block diagram of one embodiment of a system for increasing effective PWM drive signal resolution, generally designated 200, constructed according to the principles of the present invention. The system 200 includes a duty cycle calculator 220 and a duty cycle approximator 240.

The duty cycle calculator 220 is configured to calculate a theoretical duty cycle for a PWM drive signal to be provided to an associated power converter based on at least one operating condition thereof. Both the duty cycle calculator 220 and the duty cycle approximator 240 may be implemented as a sequence of operating instructions, dedicated hardware, general purpose hardware or a combination thereof. In some embodiments, the duty cycle calculator 220 and the duty cycle approximator 240 may be implemented in a DSP.

The duty cycle calculator 220 may consider more than just one operating condition. The operating conditions considered may include, for example, input current, input voltage, output current or output voltage of the power converter. Of course, other operating conditions may also be considered.

The theoretical duty cycle is capable of being outside of a set of allowable duty cycles. In some embodiments, the set of allowable duty cycles contains only integers, e.g., 49%, 50% and 51%. Alternatively, the set of allowable duty cycles may contain only members chosen as a function of a relationship between a clock rate and an interval of the PWM drive signal.

The duty cycle approximator 240, coupled to the duty cycle calculator 220, is configured to generate a sequence of allowable duty cycles that at least approximately averages to the theoretical duty cycle if the theoretical duty cycle is outside of the set. In some embodiments, the length of the sequence is at least approximately proportional to the reciprocal of the fractional part of the theoretical duty cycle. For example, if the theoretical duty cycle is 50.5% (i.e., 50½%), the length of the sequence may be 2 (1×2) or 4 (2×2) or any other multiple of the reciprocal.

Furthermore, the sequence of allowable duty cycles may contain only allowable duty cycles immediately greater than and immediately less than the theoretical duty cycle. Returning again to the example in the preceding paragraph, to obtain the theoretical duty cycle of 50.5%, the allowable duty cycles of 50% (immediately less than 50.5%) and 51% (immediately greater than 50.5%) may be in the sequence. Of course, other allowable duty cycles not immediately less than or greater than may be used to generate the theoretical duty cycle. For example, a sequence including 49% and 52% may be used.

The duty cycle approximator 240 may provide the sequence of allowable duty cycles to a comparator coupled to the DSP. Of course, if the theoretical duty cycle is within the set of allowable duty cycles, then the sequence of allowable duty cycles is not required. Instead, the theoretical duty cycle is provided to the comparator. Thus, if a theoretical duty cycle of 50% is calculated and this is an allowable duty cycle, then a value of 50 is provided to the comparator.

Thus, the duty cycle approximator 240 allows the system 200 to operate as if driven by a faster clock. For example, again using a 10 MHz clock, the duty cycle approximator 240 allows the system 200 to provide a PWM drive signal that performs as if driven by a 20 MHz clock. The resolution, therefore, has been doubled without increasing clock speed. Accordingly, the duty cycle approximator 240 may allow even a greater resolution increase (tripled or quadrupled for 33 KHz and 25 KHz) as long as the driving frequency is much higher than a corner frequency of an output filter.

Figure 3:
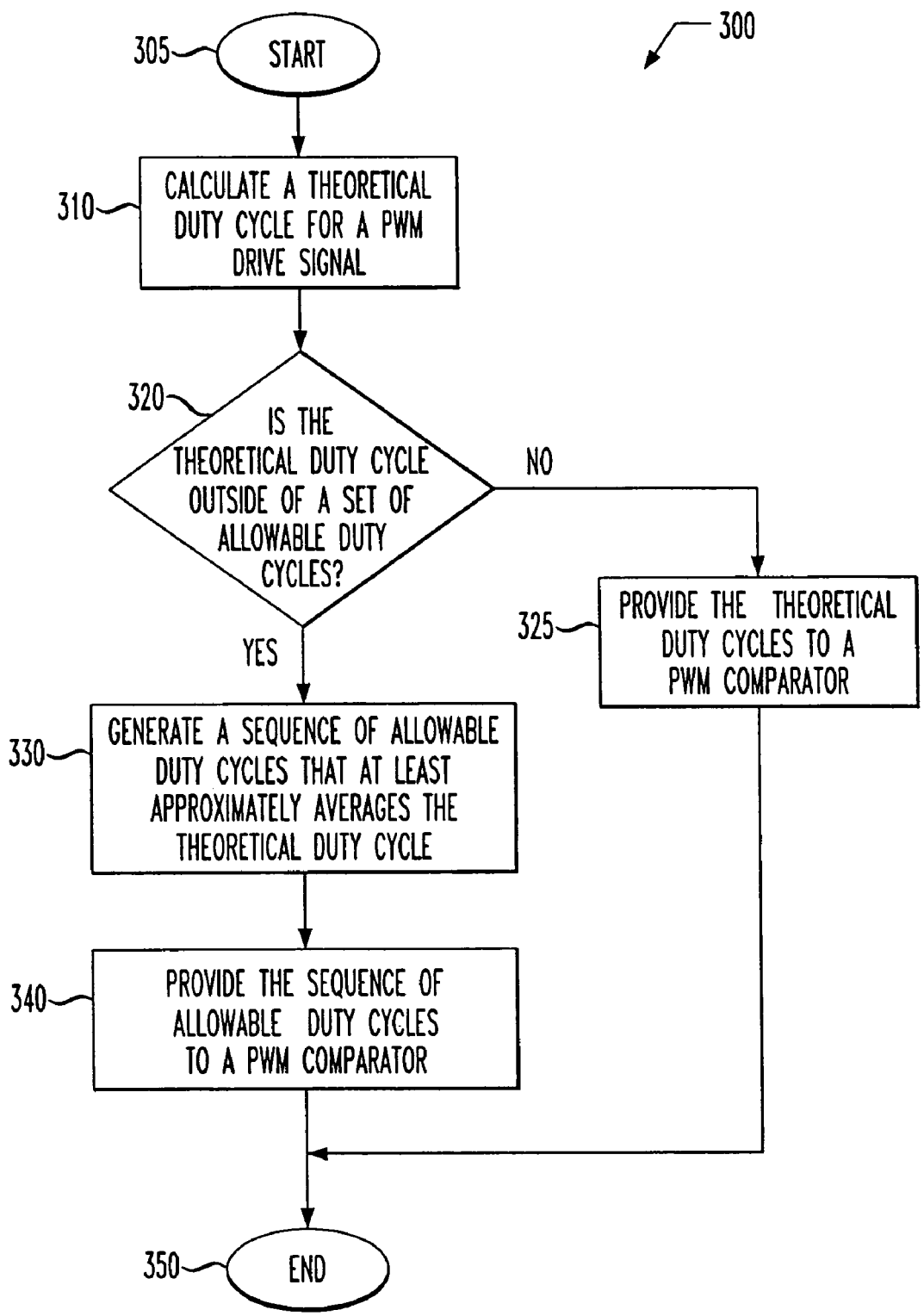
FIG. 3 illustrates a flow diagram of one embodiment of a method of increasing effective PWM drive signal resolution carried out according to the principles of the present invention.

Turning now to FIG. 3, illustrated is a flow diagram of one embodiment of a method of increasing effective PWM drive signal resolution, generally designated 300, carried out according to the principles of the present invention. The method 300 may provide a PWM drive signal with an improved output resolution for a power converter. The method 300 begins in a step 305 with an intent to increase the effective PWM drive signal resolution. Each step of the method 300 may be performed within a DSP.

After starting, a theoretical duty cycle for a PWM drive signal is calculated in a step 310. The PWM drive signal is calculated based on at least one operating condition of an associated power converter in which the PWM drive signal is provided.

After calculating the theoretical duty cycle, a determination is made if the theoretical duty cycle is not a member of a pre-established set of allowable duty cycles in a decision step 320. A duty cycle approximator may make this determination. The determination may be made by comparing the theoretical duty cycle to duty cycles in the set of allowable duty cycles.

If the theoretical duty cycle is not a member of the set of allowable duty cycles, a sequence of the members of the set of allowable duty cycles is generated, wherein the sequence at least approximately averages to the theoretical duty cycle in a step 330. In some embodiments, the length of the sequence that is generated is at least approximately proportional to the reciprocal of the fractional part of the theoretical duty cycle.

The sequence of allowable duty cycles is then provided to a comparator coupled to the DSP in a step 340. The comparator may be a PWM comparator of a converter controller. The comparator may be coupled to a period comparator and a counter to provide the PWM drive signal via an associated flip-flop. After providing the sequence, the method 300 ends in a step 350.

Returning now to decision step 320, if the theoretical duty cycle is not a member of the set of allowable duty cycles, then the theoretical duty cycle is provided to the comparator in a step 325. The method 300 then continues to step 350 and ends.

Turning now to FIG. 4, illustrated is an exemplary sequence of allowable duty cycles provided by the duty cycle approximator of FIG. 2 or generated according to the method of FIG. 3. FIG. 4 represents a waveform of three sequences of the allowable duty cycles 50% and 51% that are generated to provide the theoretical duty cycle of 50.5%: The sequences of FIG. 4 can also be represented by 51%, 50%, 51%, 50%, 51%, 50%, 51%, 50%, 51%, 50%, 51%, 50%. The exemplary sequence has a constant frequency of 50 KHz which is equivalent to half of the driving frequency (100 KHz) that was discussed with respect to FIG. 2. Accordingly, the exemplary sequence creates a smaller output ripple that is easier to filter out.

The exemplary sequence of FIG. 4 represents a theoretical duty cycle of 50.5% using allowable duty cycles 50% and 51%. Of course, other allowable duty cycles may be used to generate theoretical duty cycles. Additionally, the allowable duty cycles 50% and 51% may be arranged in a different sequence to generate different theoretical duty cycles. For example, a sequence of 50%, 50%, 50%, 51%, 50%, 50%, 50%, 51%, averages to a theoretical duty cycle of 50.25%. Similarly, a sequence of 50%, 51%, 51%, 51%, 50%, 51%, 51%, 51%, averages to a theoretical duty cycle of 50.75%.

Although the present invention has been described in detail, those skilled in the art should understand that they can make various changes, substitutions and alterations herein without departing from the spirit and scope of the invention in its broadest form.

What is claimed is:

1. A system for increasing effective pulse-width modulated (PWM) drive signal resolution, comprising:
    a duty cycle calculator configured to calculate a theoretical duty cycle for a PWM drive signal to be provided to an associated power converter based on at least one operating condition thereof, said theoretical duty cycle not a member of a pre-established set of allowable duty cycles; and
    a duty cycle approximator coupled to said duty cycle calculator and configured to generate a sequence of members of the set of allowable duty cycles, wherein the sequence at least approximately averages to said theoretical duty cycle.

2. The system as recited in claim 1 wherein said at least one operating condition is selected from the group consisting of:
    input current,
    input voltage,
    output current, and
    output voltage.

3. The system as recited in claim 1 wherein said set of allowable duty cycles contains only integers.

4. The system as recited in claim 3 wherein a length of said sequence is at least approximately proportional to a reciprocal of a fractional part of said theoretical duty cycle.

5. The system as recited in claim 1 wherein said set of allowable duty cycles contains only members chosen as a function of a relationship between a clock rate and an interval of said PWM drive signal.

6. The system as recited in claim 1 wherein said duty cycle calculator and said duty cycle approximator are implemented in a processor and said duty cycle approximator provides said sequence of allowable duty cycles to a comparator coupled to said processor.

7. The system as recited in claim 1 wherein said sequence of allowable duty cycles contains only allowable duty cycles immediately greater than and immediately less than said theoretical duty cycle.

8. A method of increasing effective pulse-width modulated drive signal resolution, comprising:
    calculating a theoretical duty cycle for a PWM drive signal to be provided to an associated power converter based on at least one operating condition thereof, said theoretical duty cycle not a member of a pre-established set of allowable duty cycles; and
    generating a sequence of members of the set of allowable duty cycles, wherein the sequence at least approximately averages to said theoretical duty cycle.

9. The method as recited in claim 8 wherein said at least one operating condition is selected from the group consisting of:
    input current,
    input voltage,
    output current, and
    output voltage.

10. The method as recited in claim 8 wherein said set of allowable duty cycles contains only integers.

11. The method as recited in claim 10 wherein a length of said sequence is at least approximately proportional to a reciprocal of a fractional part of said theoretical duty cycle.

12. The method as recited in claim 8 wherein said set of allowable duty cycles contains only members chosen as a function of a relationship between a clock rate and an interval of said PWM drive signal.

13. The method as recited in claim 8 wherein said calculating and said generating are carried out in a processor and said generating comprises providing said sequence of allowable duty cycles to a comparator coupled to said processor.

14. The method as recited in claim 8 wherein said sequence of allowable duty cycles contains only allowable duty cycles immediately greater than and immediately less than said theoretical duty cycle.

15. A power converter, comprising:
    at least one power switch interposing at least two input lines and at least two output lines; and
    a converter controller for providing a PWM drive signal to said at least one power switch, including:
        a duty cycle calculator configured to calculate a theoretical duty cycle for said PWM drive signal based on at least one operating condition of said power converter, said theoretical duty cycle not a member of a pre-established set of allowable duty cycles, and
        a duty cycle approximator coupled to said duty cycle calculator and configured to generate a sequence of members of the set of allowable duty cycles, wherein the sequence at least approximately averages to said theoretical duty cycle.

16. The power converter as recited in claim 15 wherein said at least one operating condition is selected from the group consisting of:

input current,
input voltage,
output current, and
output voltage.

17. The power converter as recited in claim 15 wherein said set of allowable duty cycles contains only integers.

18. The power converter as recited in claim 17 wherein a length of said sequence is at least approximately proportional to a reciprocal of a fractional part of said theoretical duty cycle.

19. The power converter as recited in claim 15 wherein said set of allowable duty cycles contains only members chosen as a function of a relationship between a clock rate and an interval of said PWM drive signal.

20. The power converter as recited in claim 15 wherein said duty cycle calculator and said duty cycle approximator are implemented in a processor and said duty cycle approximator provides said sequence of allowable duty cycles to a comparator coupled to said processor.

21. The power converter as recited in claim 15 wherein said sequence of allowable duty cycles contains only allowable duty cycles immediately greater than and immediately less than said theoretical duty cycle.

* * * * *